US010378986B1

(12) United States Patent
Scardelletti

(10) Patent No.: US 10,378,986 B1
(45) Date of Patent: Aug. 13, 2019

(54) CLAPP-TYPE OSCILLATORS FOR HIGH TEMPERATURE PRESSURE SENSOR SYSTEMS

(71) Applicant: United States of America as represented by the Administrator of NASA, Washington, DC (US)

(72) Inventor: Maximilian C. Scardelletti, Brunswick, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 203 days.

(21) Appl. No.: 15/484,240

(22) Filed: Apr. 11, 2017

Related U.S. Application Data

(60) Provisional application No. 62/323,933, filed on Apr. 18, 2016.

(51) Int. Cl.
*G01L 9/12* (2006.01)
*G01L 9/00* (2006.01)
(Continued)

(52) U.S. Cl.
CPC .......... *G01L 9/0072* (2013.01); *G01L 5/0095* (2013.01); *G01L 9/007* (2013.01);
(Continued)

(58) Field of Classification Search
CPC ... G01L 19/147; G01L 9/0042; G01L 9/0072; G01L 13/025; G01L 19/04; G01L 9/0054; G01L 9/0075; G01L 19/0038; G01L 19/0084; G01L 19/14; G01L 19/0069; G01L 19/0618; G01L 19/0645; G01L 9/0055; G01L 9/0073; G01L 19/0092; G01L 19/143; G01L 9/0051; G01L 9/0052; G01L 11/025; G01L 19/0007; G01L 19/0046; G01L 19/06; G01L 19/0627; G01L 19/0681; G01L 9/00; G01L 9/0041; G01L 9/0044; G01L 11/04; G01L 19/0023; G01L 19/0672; G01L 19/069; G01L 19/142; G01L 19/16; G01L 27/002; G01L 7/00; G01L 7/163; G01L 7/166; G01L 9/0047; G01L 11/02; G01L 13/00; G01L 15/00; G01L 19/0609; G01L 19/083; G01L 19/10; G01L 19/148; G01L 7/08; G01L 9/0045; G01L 9/0048; G01L 9/006; G01L 9/007; G01L 9/0076; G01L 9/045; G01L 9/06; G01L 9/065; G01L 9/12;

(Continued)

(56) References Cited

U.S. PATENT DOCUMENTS

| 3,122,919 | A | * | 3/1964 | Kendrick | ................. F41G 3/32 331/117 R |
| 4,067,241 | A | * | 1/1978 | Corbett | ................. G01L 1/162 310/331 |
| 5,789,990 | A | * | 8/1998 | Ash | ....................... H03B 5/326 331/107 A |

* cited by examiner

*Primary Examiner* — Andre J Allen
(74) *Attorney, Agent, or Firm* — Robert H. Earp, III; William M. Johnson

(57) ABSTRACT

Pressure sensors are disclosed that may perform health monitoring in-situ in harsh operating environments. The pressure sensors may be based on a Clapp-type oscillator that includes one or more resistors, one or more inductors, capacitors, a sensor, and a transistor. Such pressure sensors may be particularly well-suited various applications, such as gas turbine engines, oil and gas extraction, vehicle engines, and exhaust monitoring.

20 Claims, 20 Drawing Sheets

(51) Int. Cl.
*H03B 5/12* (2006.01)
*G01L 5/00* (2006.01)
(52) U.S. Cl.
CPC .......... *G01L 9/0094* (2013.01); *H03B 5/1228* (2013.01); *G01L 9/0089* (2013.01); *H03B 2200/0006* (2013.01)
(58) Field of Classification Search
CPC ......... G01L 9/125; G01L 11/00; G01L 17/00; G01L 19/00; G01L 19/0015; G01L 19/003; G01L 19/0076; G01L 19/02; G01L 19/08; G01L 19/141; G01L 19/145; G01L 19/146; G01L 1/142; G01L 1/2262; G01L 1/246; G01L 21/12; G01L 23/16; G01L 27/005; G01L 27/007; G01L 7/04; G01L 7/063; G01L 7/082; G01L 7/084; G01L 7/086; G01L 7/16; G01L 9/0002; G01L 9/0007; G01L 9/0016; G01L 9/0019; G01L 9/0022; G01L 9/0027; G01L 9/0033; G01L 9/0039; G01L 9/005; G01L 9/0058; G01L 9/0077; G01L 9/0079; G01L 9/008; G01L 9/0092; G01L 9/0095; G01L 9/025; G01L 9/04; G01L 9/08; G01L 9/085; G01L 9/105; G01L 9/14; G01L 9/16
USPC .................................................. 73/700–756
See application file for complete search history.

1000

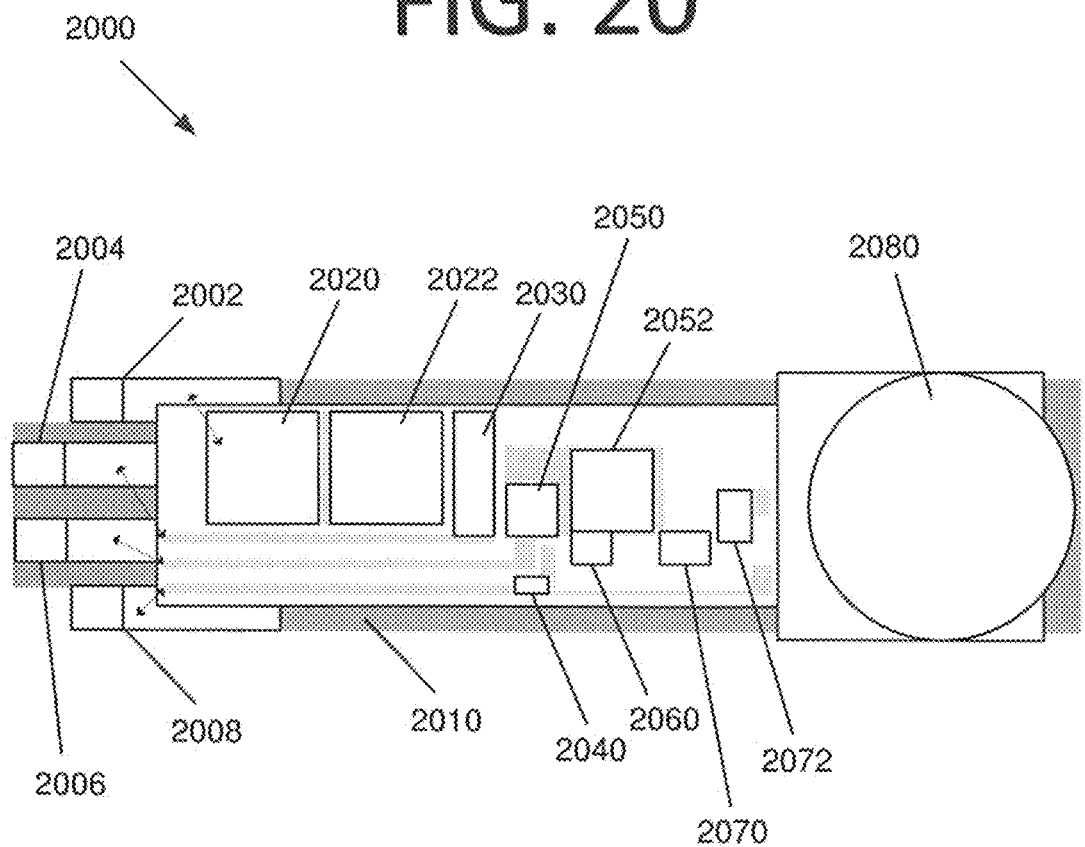

CLAPP-TYPE OSCILLATORS FOR HIGH TEMPERATURE PRESSURE SENSOR SYSTEMS

CROSS REFERENCE TO RELATED APPLICATION

This application claims the benefit of U.S. Provisional Patent Application Ser. No. 62/323,933 filed Apr. 18, 2016. The subject matter of this earlier-filed application is hereby incorporated by reference in its entirety.

ORIGIN OF THE INVENTION

The invention described herein was made by employees of the United States Government and may be manufactured and used by or for the Government for Government purposes without the payment of any royalties thereon or therefore.

FIELD

The present invention generally pertains to sensors, and more specifically, to pressure sensors for performing health monitoring in-situ in harsh operating environments.

BACKGROUND

The demonstrated utility and economic viability of microsystems technology in applications where silicon-based electronics are well suited to the environmental conditions, such as consumer electronics, healthcare, and telecommunications, has stimulated demand for comparable systems for environmentally demanding applications. Implementations of microsystems in these areas are envisioned to improve efficiency and extend operational lifetime of key components by enabling closed-loop control through the integration with control electronics. However, the harsh operating environments in high temperature and/or vibration environments, such as gas turbine engines, oil and gas drilling equipment, and vehicle engines and exhaust, significantly impede the ability to accurately diagnose potential problems.

Currently, these systems lack the type of on-board control that is possible using microsystems technology due to the extreme operating conditions of system. In situations where sensor-based technologies have been implemented, the sensing part of the system is often offset from the position of interest due to inherent temperature limitations of the electronics, peripheral passive components (capacitors, inductors), and often the sensing elements themselves. Advancements in packaging technologies have not been sufficient to overcome the temperature limitations while maintaining miniaturization, which are ultimately bounded by the temperature stability of the silicon-based electronics.

Approaches to locate the temperature-sensitive electronic components to cooler sections of the system have been implemented, but these approaches result in a much larger system that has significantly more wiring, larger packaging, and degradation of the transduced signal due to the displacement of the signal conditioning electronics from the sensor. Next generation maintenance and monitoring systems are envisioned to adopt an integrated approach, which requires distributed control systems using smart sensing technologies. Smart sensing technologies that could monitor pressure, temperature, vibration, and emissions may significantly improve engine performance and service lifetime. However, such smart sensing systems require deployment in some of the most aggressive environments of an engine in order to provide more accurate in-situ dynamic data acquisition. Conventional systems are ill-suited for such deployment. Accordingly, an improved sensor system may be beneficial.

SUMMARY

Certain embodiments of the present invention may be implemented and provide solutions to the problems and needs in the art that have not yet been fully solved by conventional engine sensor technologies. For example, some embodiments of the present invention pertain to pressure sensors that perform health monitoring in-situ in harsh operating environments, such as in piston or turbine engines.

In an embodiment, an apparatus includes an inductor and a pressure sensing capacitor connected to the inductor in series. The apparatus also includes a first capacitor, a second capacitor, and a field effect transistor (FET) connected to the inductor, the pressure sensing capacitor, the first capacitor, and the second capacitor. The inductor, the pressure sensing capacitor, the first capacitor, the second capacitor, and the FET form a Clapp-type oscillator. The apparatus is configured to operate at temperatures in excess of 400° C.

In another embodiment, a capacitive pressure sensor includes an inductor and a pressure sensing capacitor connected to the inductor in series. The capacitive pressure sensor also includes a first capacitor, a second capacitor, and a FET connected to the inductor, the pressure sensing capacitor, the first capacitor, and the second capacitor. The capacitive pressure sensor further includes a gate, a drain, and DC bias circuitry operably connected to the gate and the drain. The DC bias circuitry includes a series resistor on the gate, two MIM capacitors in shunt, and a wirewound inductor on the drain. The inductor, the pressure sensing capacitor, the first capacitor, the second capacitor, and the FET form a Clapp-type oscillator. The capacitive pressure sensor is configured to operate at temperatures in excess of 400° C.

In yet another embodiment, a Clapp-type oscillator includes an inductor and a pressure sensing capacitor connected to the inductor in series. The Clapp-type oscillator also includes a first capacitor, a second capacitor, and a FET connected to the inductor, the pressure sensing capacitor, the first capacitor, and the second capacitor.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 20 is a top view illustrating an assembled pressure sensor system, according to an embodiment of the present invention.

DETAILED DESCRIPTION OF THE EMBODIMENTS

Some embodiments of the present invention pertain to pressure sensors that perform health monitoring in-situ in harsh operating environments. The pressure sensor system of some embodiments is based on a Clapp-type oscillator that includes one or more resistors, one or more inductors, capacitors, a sensor, and a transistor. Even though the sensor and active device may be considered critical for the system of some embodiments, the resistor(s), inductor(s), and capacitors may be considered of equal importance in some embodiments since they should perform reliably at the same temperatures. Thus, it is imperative in some embodiments that each of the passive components do not compromise the performance of the pressure sensor system over its operational temperature range. Otherwise, the performance of the oscillator can change considerably, if not fail all together.

Some embodiments may be particularly well-suited for operation in gas turbine engines, such as those used on aircraft or for power production. However, embodiments are not limited to turbine engine applications and other aerospace applications. For instance, some embodiments may be applied to oil and gas extraction (deep drilling can realize temperatures of over 300° C.), vehicle engines and exhaust monitoring, or any other suitable application without deviating from the scope of the invention.

The pressure sensor system of some embodiments includes: (1) a SiCN microelectromechanical systems (MEMS)-based SiC capacitive pressure sensor; (2) a 6H-SiC metal-semiconductor field-effect transistor (MESFET); (3) SiC-based metal-insulator-metal (MIM) capacitors, (4) spiral inductors and loop, slot and chip antennas; and (5) a thermoelectric energy harvester. Per the above, the sensor system in some embodiments is based on a Clapp-type oscillator where the capacitive pressure sensor is located in the LC tank circuit, which is driven into oscillation by the MESFET. Transduction may be achieved by a pressure-induced change in resonant frequency resulting from a capacitance change from the sensor. The sensor system may be encased in a custom package to enable a maximum system operating temperature of 400° C., a pressure range of 0 to 350 PSIG (gauge pressure), and vibrations of 5.3 $G_{rms}$ (root mean square acceleration).

Figure 1:
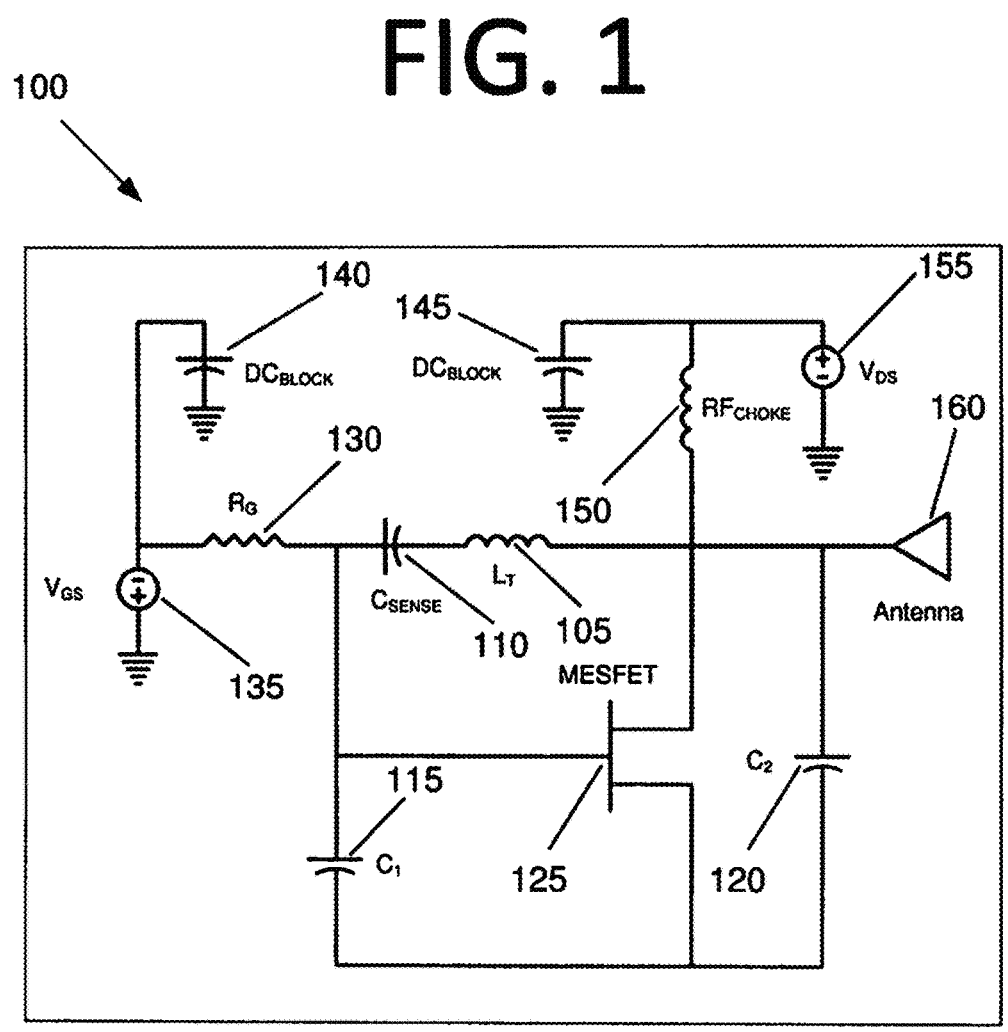
FIG. 1 is a circuit diagram illustrating a pressure sensor system, according to an embodiment of the present invention.

FIG. 1 is a circuit diagram illustrating a pressure sensor system 100, according to an embodiment of the present invention. Capacitive pressure sensor system 100 may include a Clapp-type oscillator 100 with a MEMS capacitive pressure sensor $C_{SENSE}$ 110 located in the LC tank circuit of the pressure sensor system (which includes $L_T$ 105 and $C_{SENSE}$ 110). A Clapp-type oscillator includes one inductor $L_T$ 105, three capacitors $C_{SENSE}$ 110, $C_1$ 115, $C_2$ 120, and one MESFET 125. In this embodiment, $C_{SENSE}$ 110 is a capacitive pressure sensor that varies in capacitance as a function of pressure. $C_T$, referred to later in FIG. 16, for example, may be a fixed capacitor.

A Clapp-type oscillator requires significantly fewer passive components than a Colpitts oscillator design, for example. Under conditions characteristic of a gas turbine engine (e.g., high temperature and high vibration), fewer environmentally-sensitive components within any particular system reduces the probability of failure. Moreover, since Clapp-type oscillator 100 requires fewer components, it can be made into systems with a smaller form factor, enabling deployment in confined locations. Another advantage of this Clapp-type oscillator design over a Colpitts architecture is that in Clapp-type oscillator 100, $L_T$ 105 and $C_{SENSE}$ 110 are in series. The operational frequency $\omega_0$ (i.e., the frequency of oscillation) can be found with $$\omega_0 = \frac{1}{\sqrt{L_T C_{EQ}}} \quad (1)$$

and the equivalent capacitance can be found with $$\frac{1}{C_{EQ}} = \frac{1}{C_{SENSE}} + \frac{1}{C_1 + C_{DS}} + \frac{1}{C_2 + C_{GS}} \quad (2)$$

where $C_{DS}$ and $C_{GS}$ are the transistor capacitances. However, $C_{DS}$ and $C_{GS}$ are usually negligible, so Eq. (2) reduces to $$\frac{1}{C_{EQ}} = \frac{1}{C_{SENSE}} + \frac{1}{C_1} + \frac{1}{C_2} \quad (3)$$

Furthermore, since $C_{SENSE}$ 110 is usually much smaller than $C_1$ 115 and $C_2$ 120, Eq. (3) reduces to $$\frac{1}{C_{EQ}} = \frac{1}{C_{SENSE}} \quad (4)$$

Therefore, Eq. (1) becomes $$\omega_0 = \frac{1}{\sqrt{L_T C_{SENSE}}} \quad (5)$$

$C_{SENSE}$ 110 can thus be used to set the operational frequency range. Furthermore, with a tunable inductor (or as in this case, a capacitive pressure sensor) that varies as a function of pressure, the impedance should remain inductive over the entire range of $C_{SENSE}$ 110, and can be verified with $$Z_T = j\left(\omega L_T - \frac{1}{\omega C_{SENSE}}\right) \quad (6)$$

$C_1$ 115 and $C_2$ 120 can be used to control the transconductance (gm) condition, which can be found with $$\frac{gm}{\omega_0^2 R_S C_1 C_2} > 1 \quad (7)$$

where $R_S$ is the series resistance within $L_T$ 105.

This configuration improves the frequency stability of the circuit, making the frequency stability of Clapp-type oscillator 100 better than that of a Colpitts oscillator. The frequency stability of Clapp-type oscillator 100 due to the change in capacitance is found with $$\Delta \omega_0 = -\frac{1}{2} \omega_0 \frac{\Delta C_{EQ}}{C_{EQ}} \quad (8)$$

$C_{EQ}$ is the equivalence capacitance, which is essentially $C_{SENSE}$ in this case. The changes in the equivalent capacitance usually come from the active device (i.e., MESFET 125). If $C_1$ 115 and $C_2$ 120 are designed with large values, $C_{EQ}$ is approximately $C_{SENSE}$ 110, making $\Delta \omega$ independent of the active device. Thus, when operating at high temperatures, such as 400° C., the pressure sensing system is virtually independent of temperature.

$R_G$ 130, $V_{GS}$ 135, $DC_{BLOCK}$ 140, $DC_{BLOCK}$ 145, $RF_{CHOKE}$ 150, and $V_{DS}$ 155 are parts of DC biasing circuits. Two voltages drive MESFET 125 in this embodiment. $V_{DS}$ 155 is the drain voltage, which is typically between positive 7 to 10 volts, and $V_{GS}$ 135 is negative and usually between 7 to 10 volts as well in this embodiment. However, any suitable voltages may be used without deviating from the scope of the invention. DC blocks $DC_{BLOCK}$ 140, $DC_{BLOCK}$ 145 prevent voltage from going past their respective points. However, DC blocks may not be needed on the gate if $R_G$ 130 is sufficient. $RF_{CHOKE}$ 150 prevents RF energy from going back to the power supply (not shown). Antenna 160 enables wireless communication, reducing the size of the overall sensor system as compared to a system with physical wires.

Figure 2:
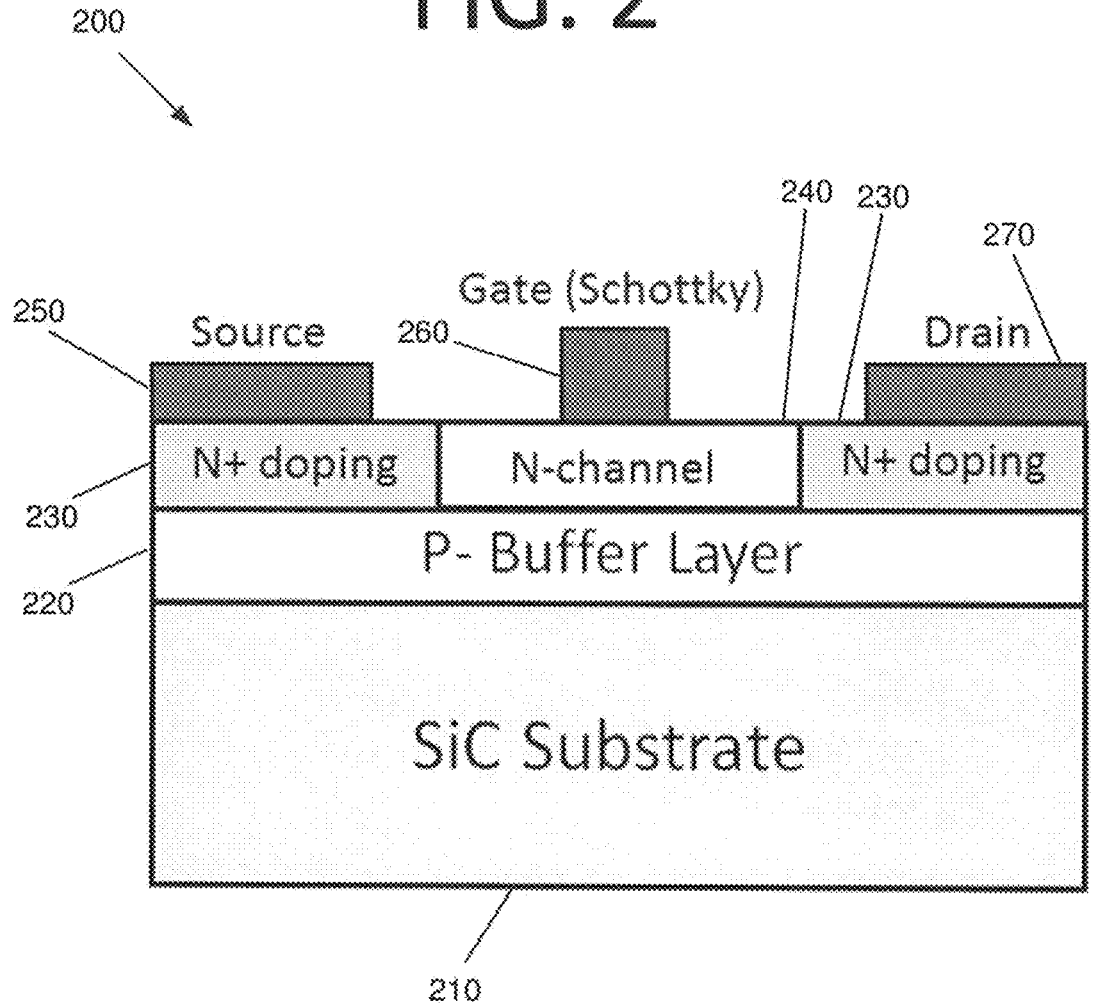
FIG. 2 is a cross-sectional view illustrating a MESFET die, according to an embodiment of the present invention.

MESFET 125 used in Clapp-type oscillator 100 may be an unpackaged 10W n-type SiC power MESFET die in some embodiments (e.g., Cree™ model number CRF24010D). MESFET 125 may have features such as a 15 decibel (dB) small signal gain, a drain-to-source breakdown voltage of over 100 Volts (V), and operation at frequencies up to 5 gigahertz (GHz). A cross-section of a MESFET die 200 is shown in FIG. 2. MESFET 200 includes a SiC substrate 210 that serves as an insulator, a p-type buffer layer 220, two N+ doped regions 230, an N– channel 240, a source 250, a gate 260, and a drain 270. Source 250, gate 260, and drain 270 are metal contacts. The contact between gate 260 and N– channel 240 form a Schottky barrier, and when a negative voltage is applied to gate 260, a depletion region is created under gate 260 that extends into N– channel 240, reducing the current. Consequently, due to the Schottky barrier, there is negligible gate current.

Increasing the negative gate voltage will eventually cause the depletion region to extend completely through the channel, and the drain current is pinched off. Once pinch off is reached, a positive voltage can be applied to drain 270 and then the negative voltage on gate 260 can be decreased, allowing current to flow through N– channel 240 until the desired operational current is reached. P-type buffer layer 220 prevents channel electrons from entering SiC substrate 210. MESFET die 200 may be used as the active device, such as MESFET 125 in FIG. 1.

The MEMS capacitive pressure sensor $C_{SENSE}$ 110 used in Clapp-type oscillator 100 in some embodiments may be one such as that developed by Sporian Microsystems™. One electrode of the $C_{SENSE}$ 110 may be fabricated on a SiCN deflecting chamber diaphragm and the second electrode may be on a fixed SiCN substrate, forming a sealed chamber. The sealed cavity may be flip-chip bonded onto a SiCN substrate with gold (Au) contacts. $C_{SENSE}$ 110 is operational up to 500° C. and 500 psi in some embodiments.

MIM Capacitors

The Clapp-type oscillator includes two metal-insulating-metal (MIM) capacitors $C_1$ 115 and $C_2$ 120 with a titanate insulator and a titanium/platinum/gold metallization layer on both sides in some embodiments. The titanate insulator may have a dielectric constant of 40 and a thickness of 1.016 mm. MIM capacitors $C_1$ 115 and $C_2$ 120 may have square areas of 4 and 12.25 mm², respectively, in some embodiments, which result in capacitances of approximately 14 and 41 pF, respectively. MIM capacitors $C_1$ 115 and $C_2$ 120, as well as inductors 105, 150 and resistor 130, were characterized on CoorsTek™ 996 Alumina Superstrate and Ti/Au metallization patterns were used to facilitate the measurement in an implemented embodiment.

MIM capacitors $C_1$ 115 and $C_2$ 120 were not commercially available, and thus had to be fabricated. These components may be fabricated in some embodiments on CoorsTek™ Alumina Superstars, which have a dielectric constant of 9.9 and dielectric thickness of 500 μm. The system may further utilize thermoelectric generators (TEG) to power scavenge over 80% of the power required to operate this system. Power scavenging has not been previously demonstrated with a capacitive pressure sensor system.

To verify performance of the capacitors at high temperatures and at the desired operational frequency range, the capacitors were characterized using three approaches. In the first approach, the S-parameters were recorded with an network analyzer from room temperature (25° C.) to 400° C. in steps of 50° C. over a frequency range of 10 to 200 MHz. To facilitate the measurement, a high temperature probe station was used. The probe station included a ceramic heater on a chuck made of a high temperature insulating tile, a thermocouple, and power source. A LabView™ program was used to control the temperature settings.

Figure 3:
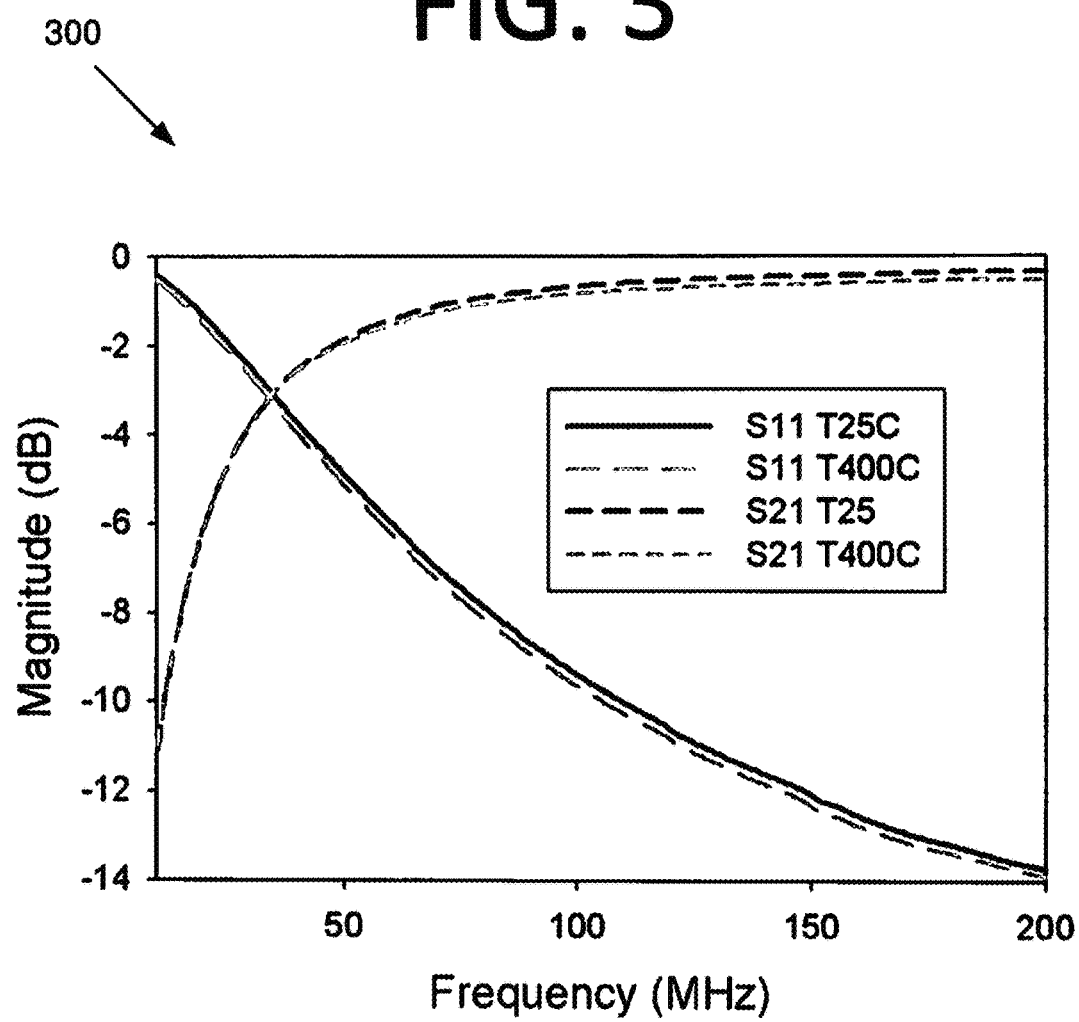
FIG. 3 is a graph illustrating measured S-parameters of a 41 pF MIM capacitor at 25° C. and 400° C., according to an embodiment of the present invention.

Ground-signal-ground (GSG) high temperature probes with a 150 μm pitch were calibrated with a short-open-load-thru (SOLT) calibration substrate to ensure accuracy to the probe tips. The calibration was only performed at room temperature due to the temperature dependence of the calibration substrate for this testing. MIM capacitors $C_1$ 115 and $C_2$ 120 were epoxied to test fixtures on an alumina substrate. The measured S-parameters of 41 pF MIM capacitor $C_2$ at 25 and 400° C., shown in graph 300 of FIG. 3, are independent of temperature.

Figure 4:
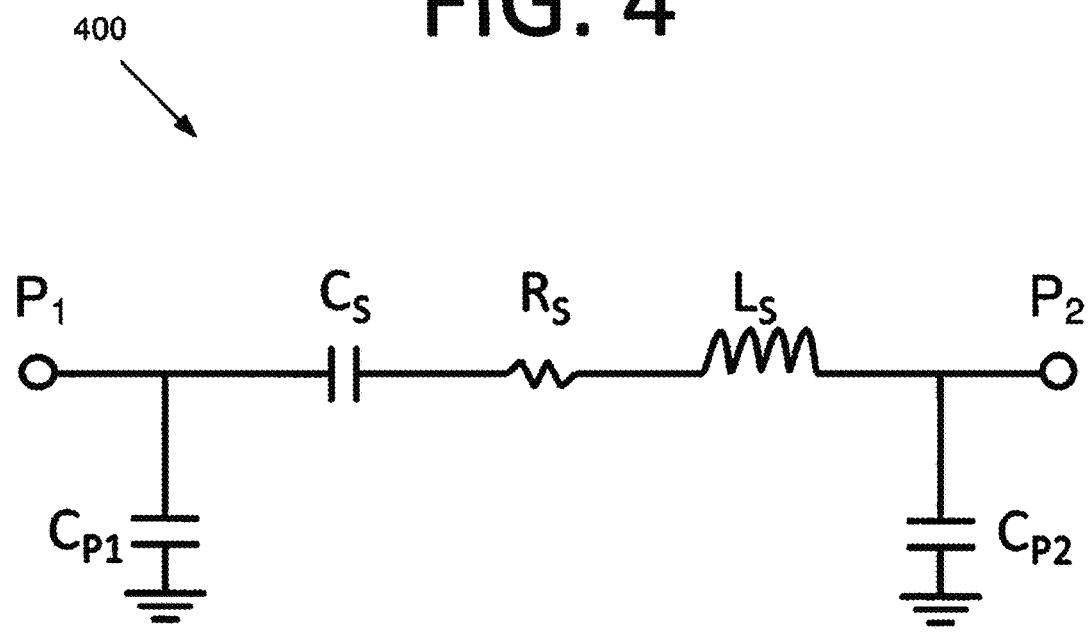
FIG. 4 is a circuit diagram illustrating an equivalent circuit model for a MIM capacitor, according to an embodiment of the present invention.
Figure 5:
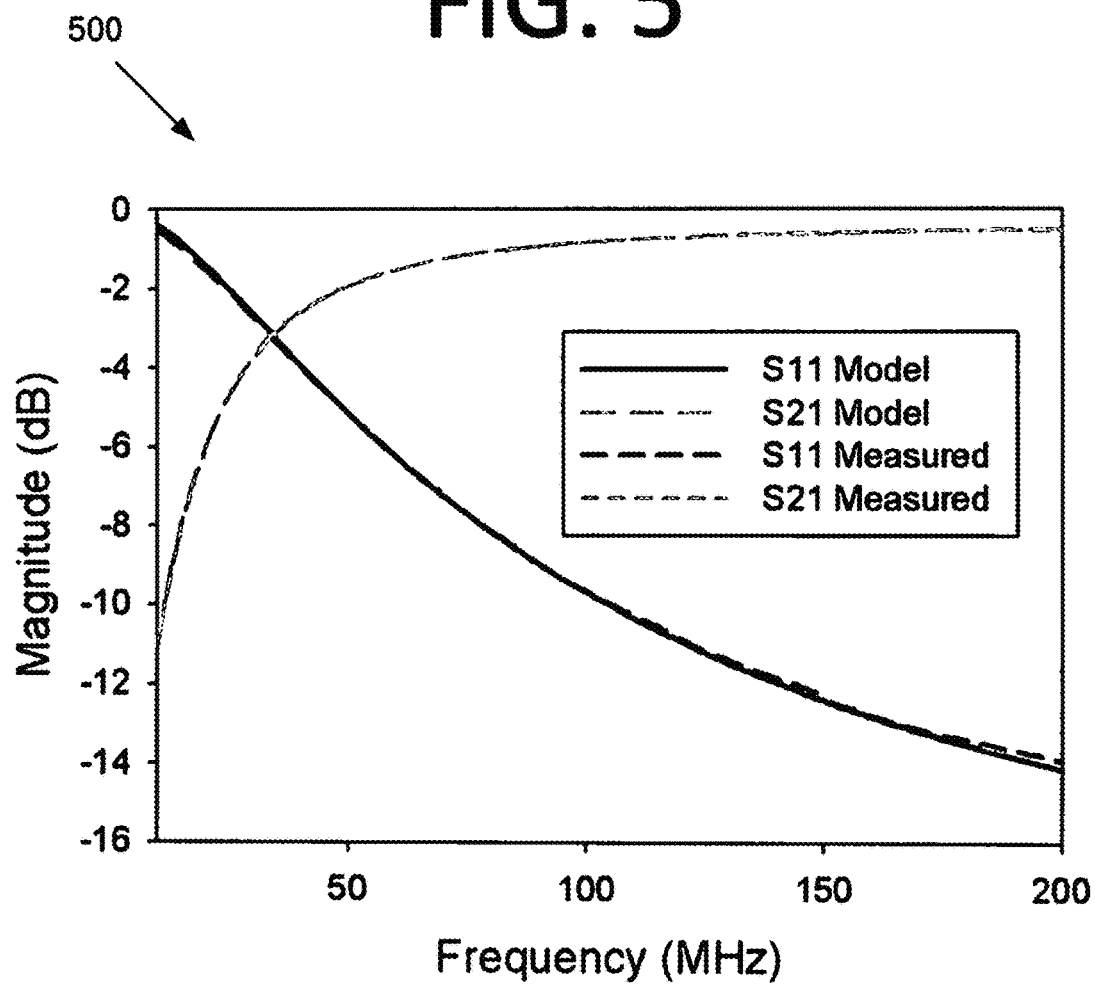
FIG. 5 is a graph illustrating a comparison between measured and optimized modeled data of a 14 pF MIM capacitor at 400° C., according to an embodiment of the present invention.

FIG. 4 is a circuit diagram illustrating an equivalent circuit model 400 of a MIM capacitor. Lumped element circuit model 400 was optimized against the measured S-parameters in the Keysight™ Advanced Design System (ADS) software suite. The gradient optimizer was used in all the simulations for this testing. Lumped element model includes a series capacitance $C_S$, parasitic capacitances $C_1$, $C_2$, series resistance $R_S$, and series inductance $L_S$. To demonstrate the accuracy of the optimization approach, the S-parameters of a 41 pF MIM capacitor at 400° C. were optimized against capacitor equivalent circuit model 400, and the results are shown in graph 500 of FIG. 5. The measured and optimized traces for S11 and S21 are virtually indistinguishable from one another, indicating the validity of the lumped element.

The component values acquired from the optimization approach for both the 14 and 41 pF MIM capacitors from 25° C. to 400° C. are listed in Tables 1 and 2 below, respectively. Note that this approach results in frequency-independent component values.

TABLE 1

CIRCUIT MODEL VALUES FOR A 14 pF MIM CAPACITOR

| Temp (° C.) | $C_S$ (pF) | $R_S$ (Ω) | $L_S$ (nH) | C1 (pF) | C2 (pF) |
|---|---|---|---|---|---|
| 25 | 13.85 | 1.934 | 2.114 | 0.437 | 1.204 |
| 50 | 13.87 | 2.144 | 2.145 | 0.436 | 1.207 |
| 100 | 13.911 | 2.487 | 2.190 | 0.435 | 1.219 |
| 150 | 13.931 | 2.623 | 2.230 | 0.439 | 1.228 |
| 200 | 13.972 | 3.189 | 2.314 | 0.449 | 1.239 |
| 250 | 14.003 | 3.371 | 2.311 | 0.452 | 1.244 |
| 300 | 14.039 | 3.796 | 2.391 | 0.454 | 1.253 |
| 350 | 14.084 | 4.140 | 2.406 | 0.456 | 1.258 |
| 400 | 14.132 | 4.631 | 2.468 | 0.440 | 1.261 |

TABLE 2

CIRCUIT MODEL VALUES FOR A 41 pF MIM CAPACITOR

| Temp (° C.) | $C_S$ (pF) | $R_S$ (Ω) | $L_S$ (nH) | C1 (pF) | C2 (pF) |
|---|---|---|---|---|---|
| 25 | 42.804 | 1.778 | 2.645 | 0.352 | 1.863 |
| 50 | 42.865 | 1.916 | 2.669 | 0.346 | 1.874 |
| 100 | 42.993 | 2.245 | 2.716 | 0.344 | 1.893 |
| 150 | 43.082 | 2.482 | 2.756 | 0.352 | 1.909 |
| 200 | 43.179 | 2.834 | 2.807 | 0.357 | 1.919 |
| 250 | 43.280 | 3.112 | 2.847 | 0.364 | 1.924 |
| 300 | 43.368 | 3.325 | 2.880 | 0.367 | 1.932 |
| 350 | 43.509 | 3.668 | 2.928 | 0.363 | 1.939 |
| 400 | 43.601 | 4.064 | 2.965 | 0.357 | 1.943 |

The modeled S-parameter data shows that the values of the two MIM capacitors changes by approximately 2% from 25° C. to 400° C. $R_S$ increases by approximately 2.5Ω, which may be due the inability to calibrate out the additional loss of the probes as they approach 400° C. The shunt parasitic capacitances $C_1$, $C_2$ and the parasitic series inductance Ls are negligible for both the 14 and 41 pF MIM capacitors.

Figure 6:
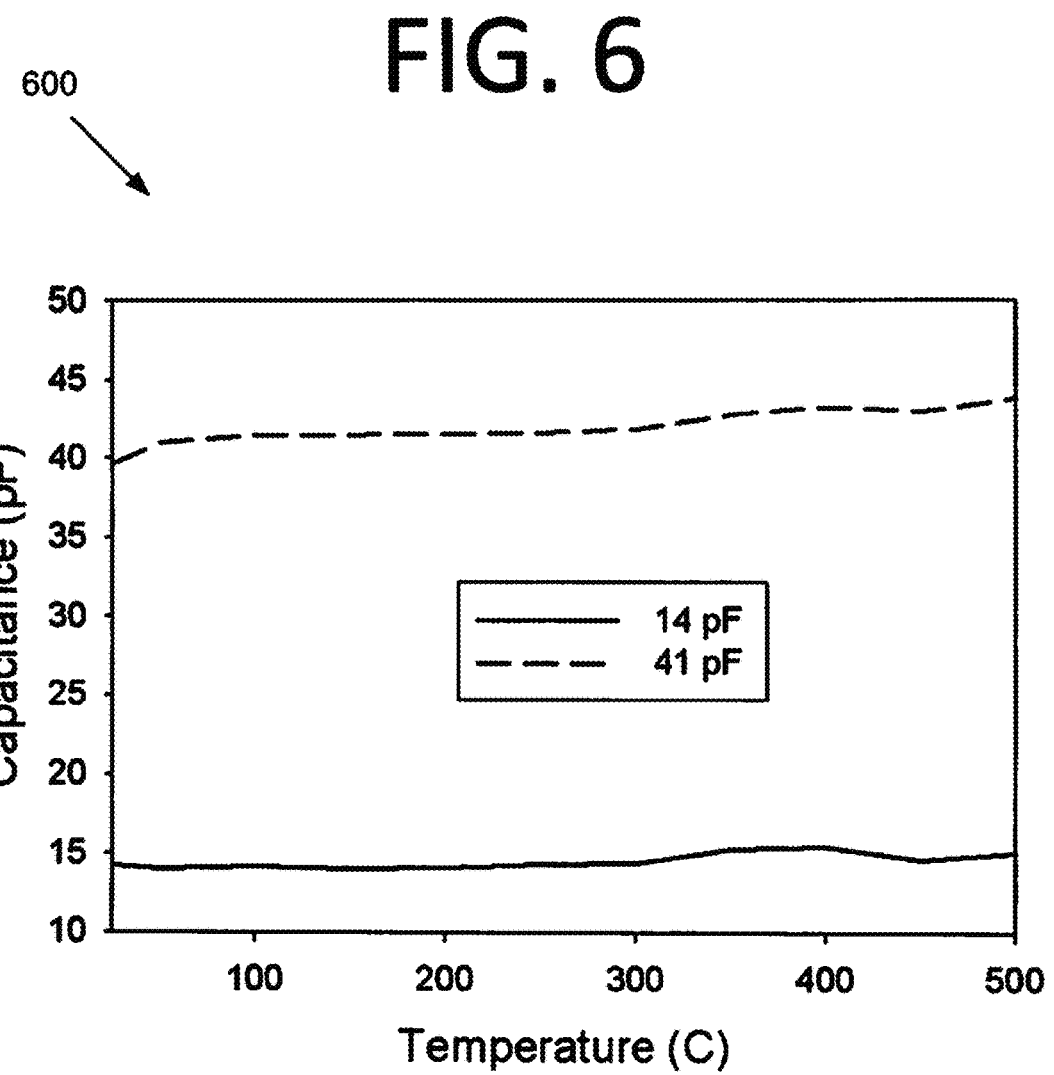
FIG. 6 is a graph illustrating MIM capacitors measured from 25° C. to 500° C. at 1 MHz on the SDA, according to an embodiment of the present invention.

The second approach used to characterize the MIM capacitors involved a semiconductor device analyzer (SDA) and high temperature probe station. The GSG probes were replaced with DC needle probes, enabling the temperature range to be extended to 500° C. The measurements were recorded from 25° C. to 500° C. in steps of 50° C. A calibration that included a phase compensation to account for the port extension and an open and short was performed to set the reference plane at the probe tips. The measurements were taken at 9.950, 9.975, 1, 1.025, and 1.050 MHz, and the average value was recorded. The results are shown in graph 600 of FIG. 6.

The 14 and 41 pF MIM capacitors change by approximately 2 to 3% from 25° C. to 400° C., and up to 5% from 400° C. to 500° C. Furthermore, the conductance was measured and found to be negligible up to 400° C., and then rose to no more than 10 μS for both the 14 and 41 pF capacitors at 500° C. It is not evident whether the degradation in electrical performance was due to the temperature dependence of the material or probe contacts beginning to degrade due to the extreme environment.

Figure 7:
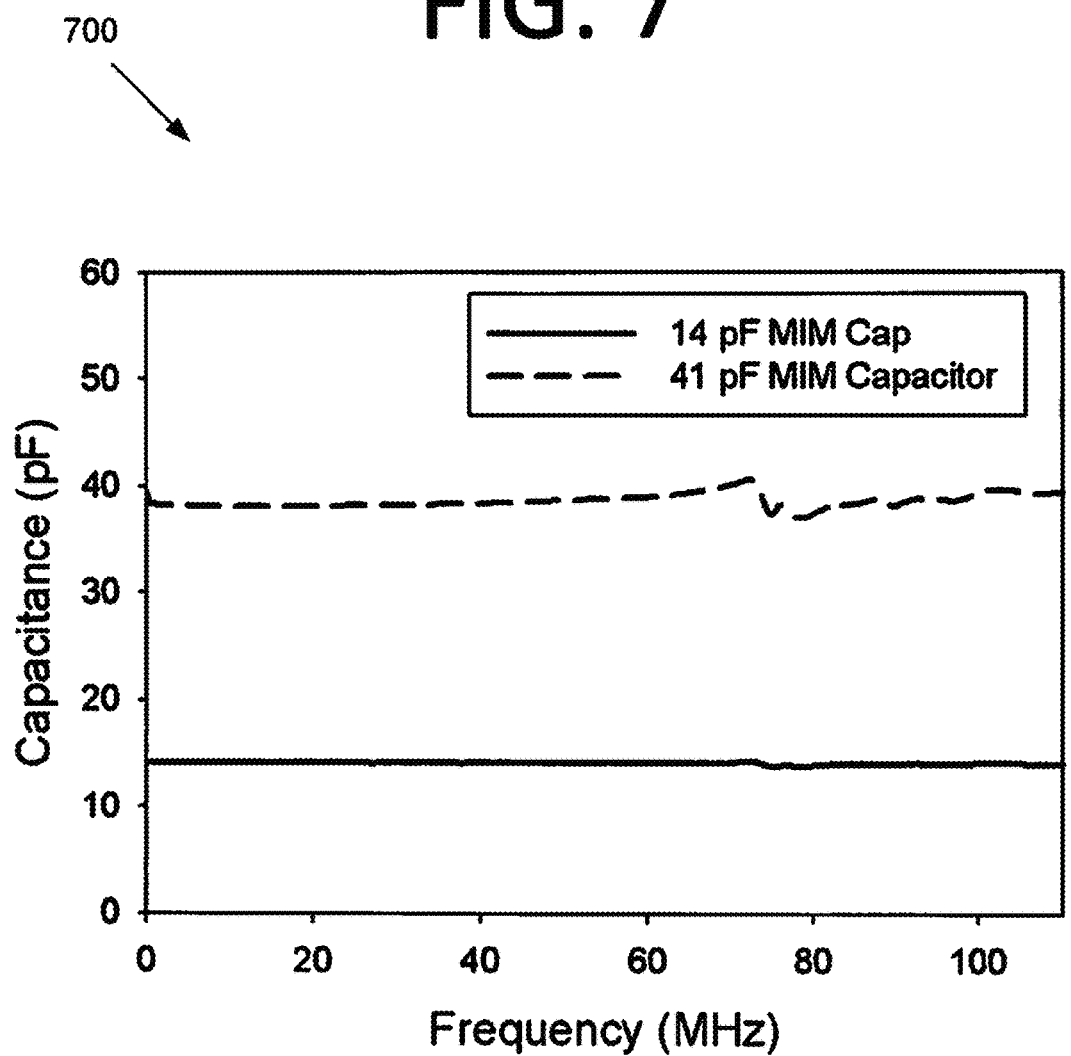
FIG. 7 is a graph illustrating MIM capacitors measured from 0.04 to 110 MHz, according to an embodiment of the present invention.

In the third approach, the MIM capacitors were measured using a four-point probing technique on an impedance analyzer from 40 Hz to 110 MHz at room temperature to determine whether they are able to operate at the desired frequency range. It is vital to ensure that the passive components do not have a self-resonant frequency (SRF) near the operating frequency range of the sensing system in some embodiments. A calibration was performed, including a phase compensation to account for the port extension, and an open, short, and load to set the reference plane at the probe tips. The measured data is shown in graph 700 of FIG. 7.

The values of the 14 and 44 pF capacitors are constant across the measured frequency range, varying by less than 2%. The fluctuation in the measured data that occurs at roughly 75 to 90 MHz is due to the calibration routine not properly working at that frequency range, and as a result, the data obtained in this frequency range is inaccurate. However, the calibration does recover around 90 MHz and is good up to 110 MHz, indicating that there is no SRF near the operational frequency range of the sensing system.

Wirewound Chip Inductors

The Clapp-type oscillator design of some embodiments also includes a 390 nH inductor, located in the LC resonate tank circuit of the device. This inductor is in series with the capacitive pressure sensor, which dictates the resonant frequency of the sensing system. The inductor used in the sensing system of some embodiments may be a Johanson™ 390 nH wirewound inductor, with dimensions of 2×1.2×1.2 mm³ (l×w×t). As with the MIM capacitors, three approaches were used to validate the response of the inductor over the desired frequency and temperature ranges.

Figure 8:
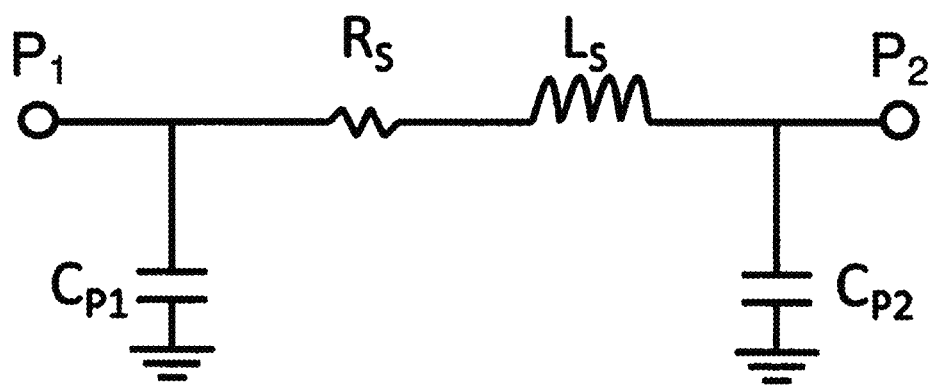
FIG. 8 is a circuit diagram illustrating an equivalent circuit model for a wirewound inductor, according to an embodiment of the present invention.

The S-parameters of the 390 nH inductor were measured in the same manner on the PNA as the capacitors. The circuit model 800 that was used is shown in FIG. 8. Model 800 includes a series inductor and resistor and two capacitors in shunt.

The S-parameters were optimized against the circuit model in ADS and the gradient optimizer is used in all the simulations. The optimization approach results were just as accurate as with the MIM capacitors, resulting in close agreement between the S11 and S21 measured and optimized modeled traces. The values for the circuit model components are shown in Table 3 below. Just as with the capacitor model components, this approach results in frequency independent component values.

TABLE 3

CIRCUIT MODEL VALUES FOR 390 WIREWOUND INDUCTOR

| Temp (° C.) | $L_S$ (nH) | $R_S$ (Ω) | C1 (pF) | C2 (pF) |
|---|---|---|---|---|
| 25 | 397.887 | 4.020 | 0.531 | 0.593 |
| 50 | 398.515 | 4.426 | 0.534 | 0.600 |
| 100 | 399.779 | 5.015 | 0.538 | 0.605 |
| 150 | 400.932 | 5.633 | 0.550 | 0.616 |
| 200 | 401.975 | 6.195 | 0.553 | 0.623 |
| 250 | 401.381 | 6.900 | 0.561 | 0.627 |
| 300 | 404.637 | 7.658 | 0.568 | 0.625 |
| 350 | 405.295 | 9.281 | 0.562 | 0.629 |
| 400 | 408.321 | 12.289 | 0.579 | 0.634 |

The value of the inductor $L_S$ increased by 3% from 25° C. to 400° C., demonstrating that the inductor is viable through this temperature range. However, the series resistance $R_S$ increases from 4.02Ω to 6.195Ω from 25° C. to 200° C., which is an increase of 53%. Furthermore, $R_S$ increased by nearly 100% from 200° C. to 400° C., thus indicating that the material composition of the inductor is beginning to deteriorate and degrade its electrical performance. Shortly after 400° C., the inductor fails, and if taken up to 500° C., the physical damage is irreversible.

Figure 9:
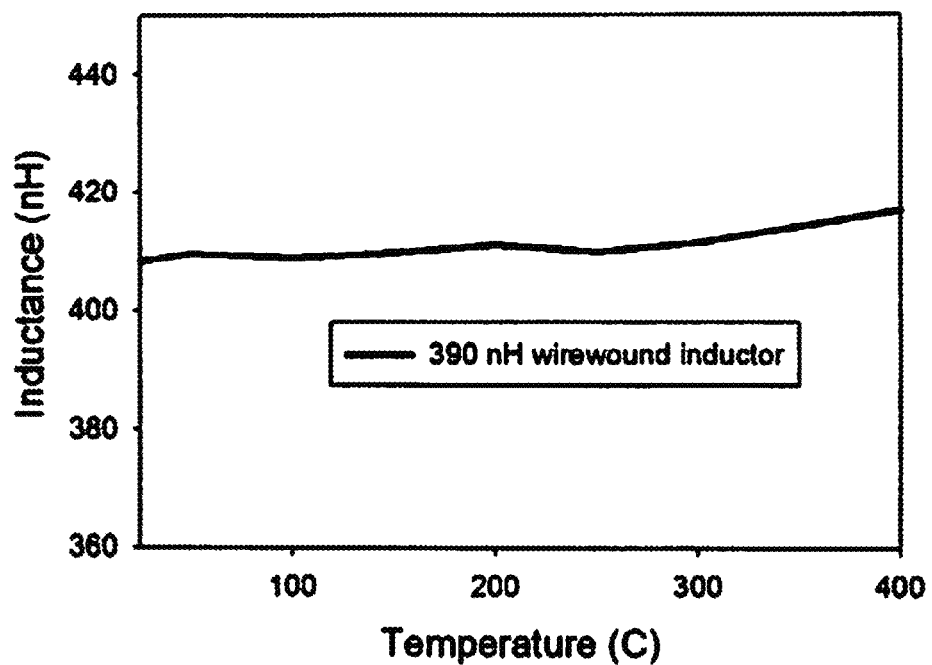
FIG. 9 is a graph illustrating a wirewound inductor measured from 25° C. to 400° C. at 1 MHz on an SDA, according to an embodiment of the present invention.
Figure 10:
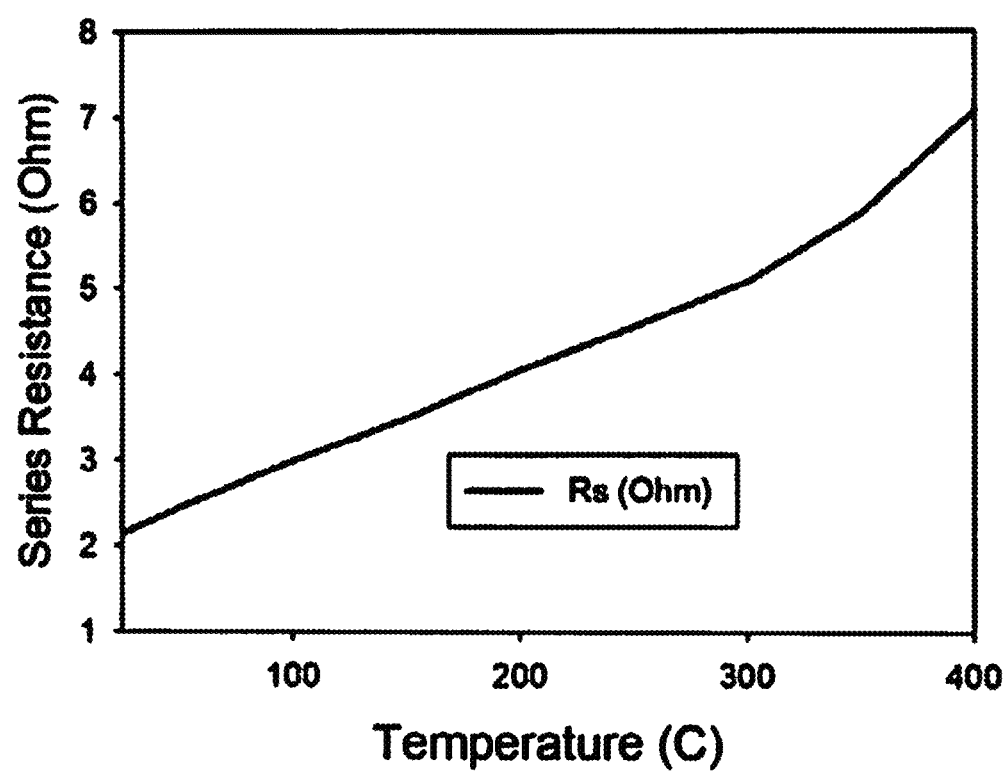
FIG. 10 is a graph illustrating series parasitic resistance characterized from 25° C. to 400° C. at 1 MHz, according to an embodiment of the present invention.

The inductors were also characterized on the SDA. The inductors were only characterized through 400° C. due to the realization that the wirewound inductors would begin to fail above this temperature. The results are shown in graph 900 of FIG. 9. The inductance of the wirewound inductor changes from 408 to 417 nH from 25° C. to 400° C., roughly 2.5%, over this temperature range. The series resistance was also characterized from 25° C. to 400° C. at 1 MHz, as shown in graph 1000 of FIG. 10. As with the inductor characterization with the optimization modeling, the series parasitic resistance is fairly linear up to 300° C., and then starts to increase rapidly to 400° C., indicating that the component is probably reaching its maximum operating temperature.

Figure 11:
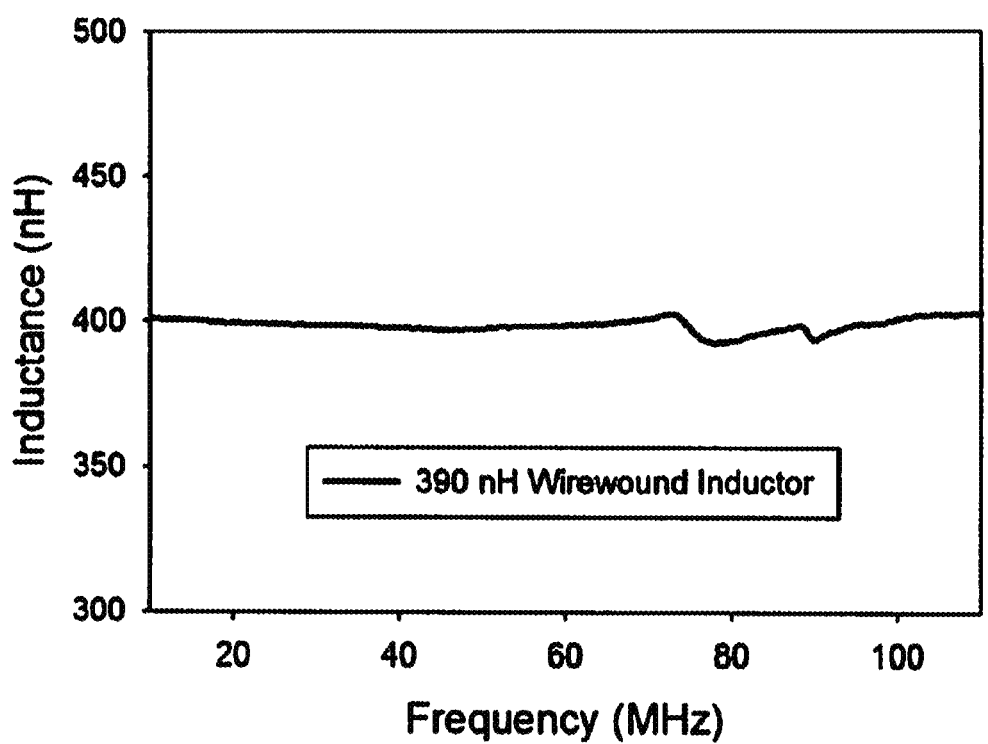
FIG. 11 is a graph illustrating series parasitic resistance of the 390 nH wirewound inductor from 0.04 to 110 MHz at room temperature, according to an embodiment of the present invention.

To determine the inductor performance over the operational frequency range of the sensing system, the inductor was characterized on the impedance analyzer from 40 to 110 MHz at room temperature, and the results are shown in graph 1100 of FIG. 11. Again, at approximately 75 to 90 MHz, the measurement is inaccurate due to an error in the calibration routine. However, from 90 to 110 MHz, the calibration recovered and from the data trace, it is evident that the inductor is operational over the design frequency range from 97 to 117 MHz.

Thick Film Chip Resistors

A 10 kΩ resistor was used in the DC bias circuit of the gate side of the SiC MESFET in some embodiments to simplify and reduce the overall size, while maintaining the ability to prevent RF from leaking back into the gate power supply. Since the gate of the FET requires no current, only RF blocking is required, and a 10 kΩ resistor is sufficiently large. The 10 kΩ thick film chip resistor may be one such as that provided by MiniSytems Inc.™ with dimensions of 1.118×0559×0.330 mm3 (l×w×t). The resistor may have a voltage and power rating of 40 V and 0.04 W, respectively.

The resistance equivalent circuit model used to optimize against the measured S-parameters of the resistor was the same circuit model used for the wirewound inductor shown in FIG. 8. The S-parameters were optimized from 10 to 200 MHz, and the gradient optimizer was used for all simulation. The results in Table 4 below show that the change in resistance from 25° C. to 400° C. is negligible. Also, the parasitics $L_S$, $C_1$, and $C_2$ are negligible as well.

TABLE 4

CIRCUIT MODEL VALUES FOR 10 kΩ CHIP RESISTOR

| Temp (° C.) | $R_S$ (kΩ) | $L_S$ (nH) | C1 (pF) | C2 (pF) |
|---|---|---|---|---|
| 25 | 10.13 | 1.00E−05 | 0.578 | 0.556 |
| 50 | 10.14 | 1.00E−05 | 0.578 | 0.559 |
| 100 | 10.07 | 1.00E−05 | 0.582 | 0.561 |
| 150 | 10.06 | 1.00E−05 | 0.588 | 0.569 |
| 200 | 10.01 | 1.00E−05 | 0.597 | 0.574 |
| 250 | 10.08 | 1.00E−05 | 0.599 | 0.578 |
| 300 | 10.08 | 1.00E−05 | 0.606 | 0.579 |
| 350 | 10.12 | 1.00E−05 | 0.612 | 0.581 |
| 400 | 10.12 | 1.00E−05 | 0.596 | 0.579 |

Figure 12:
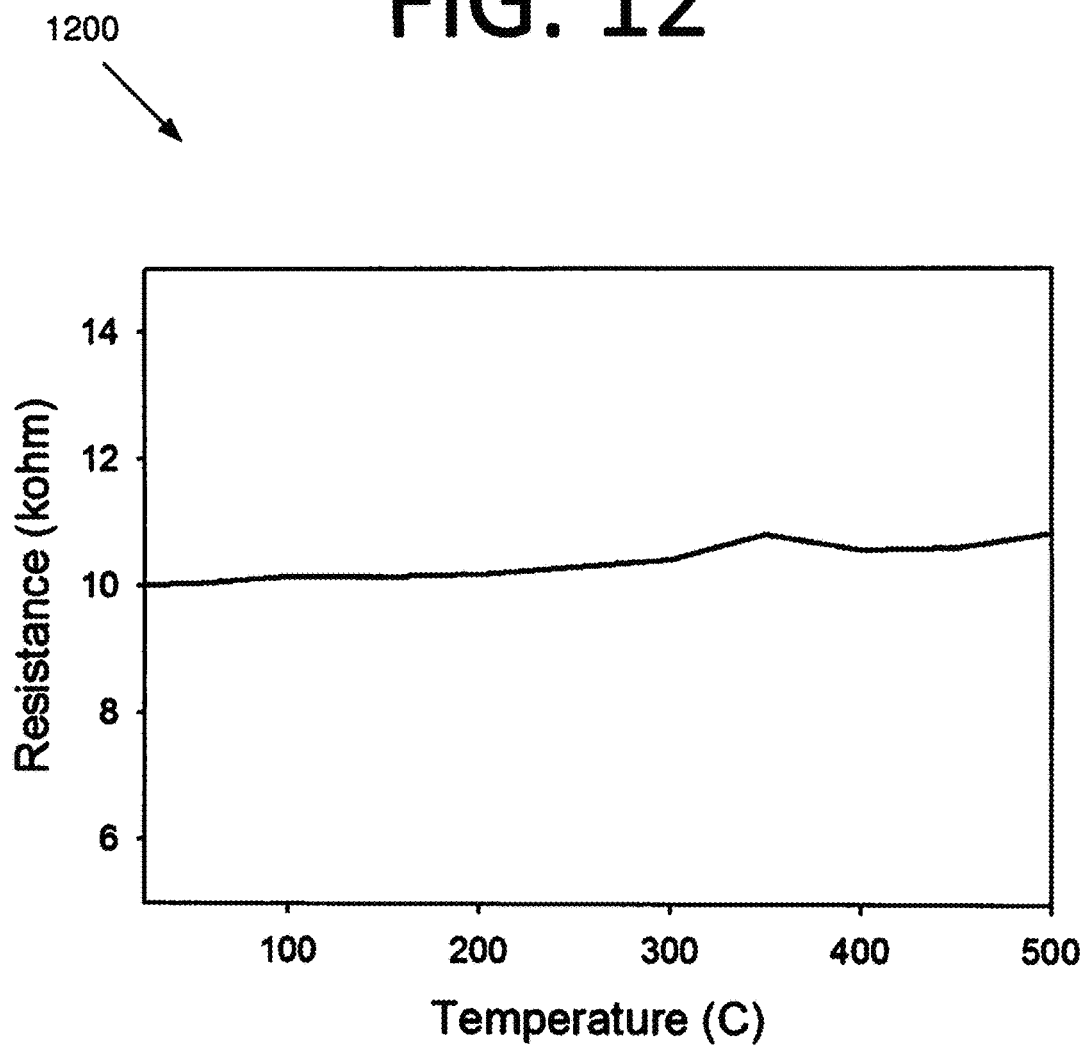
FIG. 12 is a graph illustrating 10 kΩ resistor response from 25° C. to 500° C., according to an embodiment of the present invention.

Next, the resistor was characterized from 25° C. to 500° C. with a 6½ digit multimeter, DC needle probes, and the high temperature probe station. The results are shown in graph 1200 of FIG. 12. At 25° C., the resistance is 10.1 kΩ and at 500° C., the resistance is 10.7 kΩ, which is a 6% increase in resistance over the entire temperature range. Furthermore, when the resistor is cooled to room temperature, the resistance goes back to its original value of 10.1 kΩ, indicating that this resistor is well-suited for circuits and systems that operate in temperatures up to 500° C.

Capacitive Pressure Sensor

Figure 13:
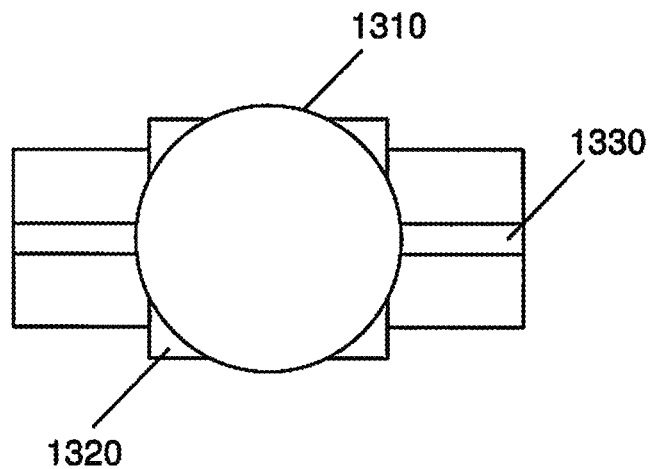
FIG. 13 is a top view illustrating a capacitive pressure sensor, according to an embodiment of the present invention.

A micro-electromechanical systems (MEMS) capacitive pressure sensor 1300, such as one developed by Sporian Microsystems™, is shown in FIG. 13. Capacitive pressure sensor 1300 includes a SiCN capacitive pressure sensor 1310, an alumina substrate 1320, and gold feed lines 1330. SiCN is a high temperature material synthesized by thermal decomposition of polymeric precursors that possesses excellent mechanical properties, tunable electric properties, and superior oxidation/corrosion resistance at temperatures up to 1600° C. SiCN capacitive pressure sensor 1310 and gold metal feed lines 1330 are fabricated on high purity alumina substrate 1320. A first electrode (not shown) of SiCN capacitive pressure sensor 1310 is fabricated on a deflecting chamber membrane that forms a sealed cavity, and a second electrode (not shown) is on fixed alumina substrate 1320. The sealed cavity is flip-chip bonded onto alumina substrate 1320 with gold contacts such that the two electrodes form a parallel plate capacitor. Thus, as pressure increases, the membrane is flexed up into the sealed cavity, causing the capacitance of SiCN capacitive pressure sensor 1310 to decrease.

Figure 14:
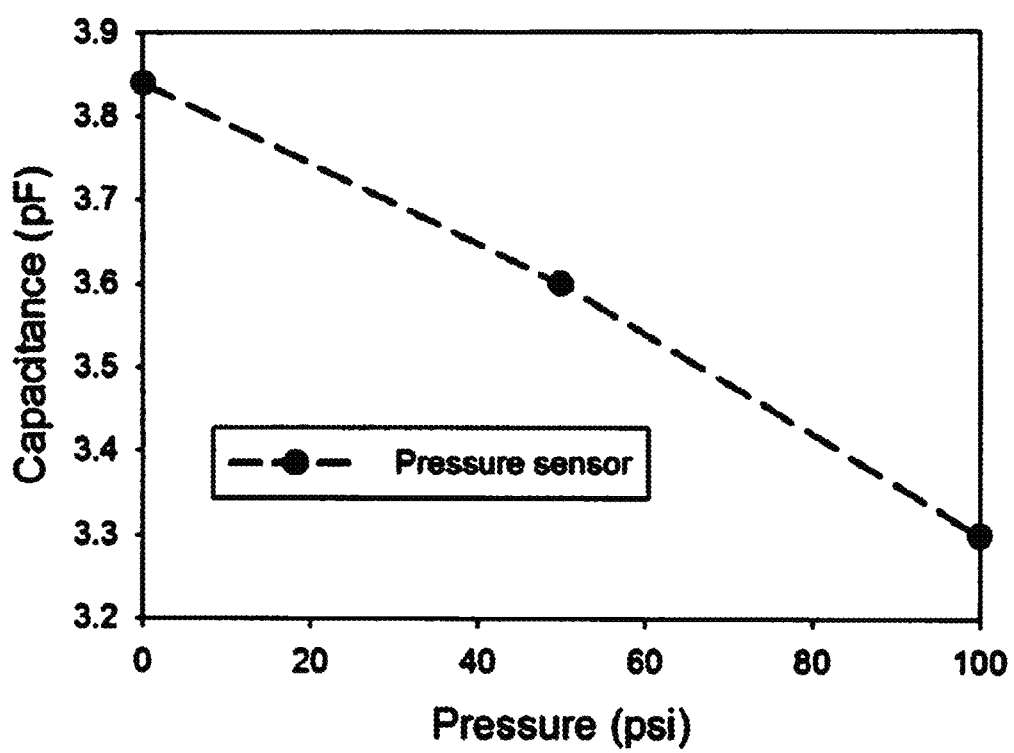
FIG. 14 is a graph illustrating a capacitive pressure sensor pressure vs. capacitance, according to an embodiment of the present invention.

Such a capacitive pressure sensor was characterized with the SDA in the manner used for the passive components in a high temperature/pressure chamber (HTPC). The HTPC was capable of operating at temperatures up to 500° C. and pressures up to 100 psi. The chamber was equipped with a 125 mm diameter quartz sight glass for signal transmission, a ceramic heater, and thermocouples located throughout the chamber to ensure accurate temperature readings. The SDA was calibrated to the leads of the pressure sensor inside the HTPC at room temperature to remove the effects of the chamber and cabling. The pressure sensor capacitance was measured at 1 MHz from 0 to 100 psi at 25° C., and the results are shown in graph 1400 of FIG. 14. Over the pressure range, the capacitance changes linearly from 3.84 to 3.3 pF, which is a ΔC of 0.54 pF. Furthermore, the pressure sensor maintains a linear response from room temperature to 500° C. over the 100 psi pressure range.

Figure 15:
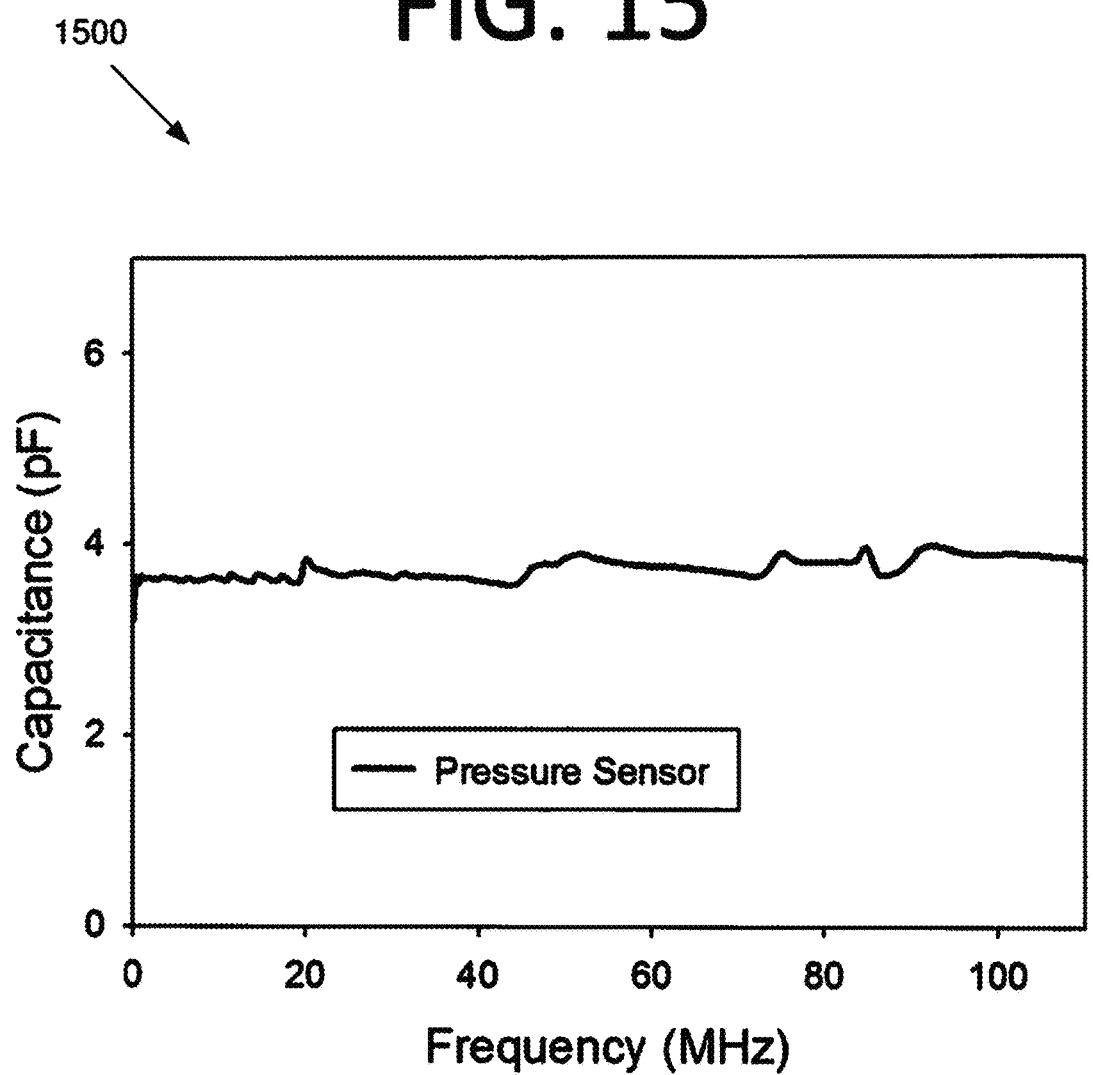
FIG. 15 is a graph illustrating capacitive pressure sensor response from 40 Hz to 110 MHz at atmospheric pressure, according to an embodiment of the present invention.

The pressure sensor was also characterized from 40 Hz to 110 MHz at atmospheric pressure with the impedance analyzer, and the results are shown in graph 1500 of FIG. 15. The response indicates that the pressure sensor capacitance at room temperature does not vary significantly and there is no indication of the SRF over the operational frequency of the pressure sensor system. The roughness in the trace is mainly due to the calibration.

Pressure Sensor System Design

Figure 16:
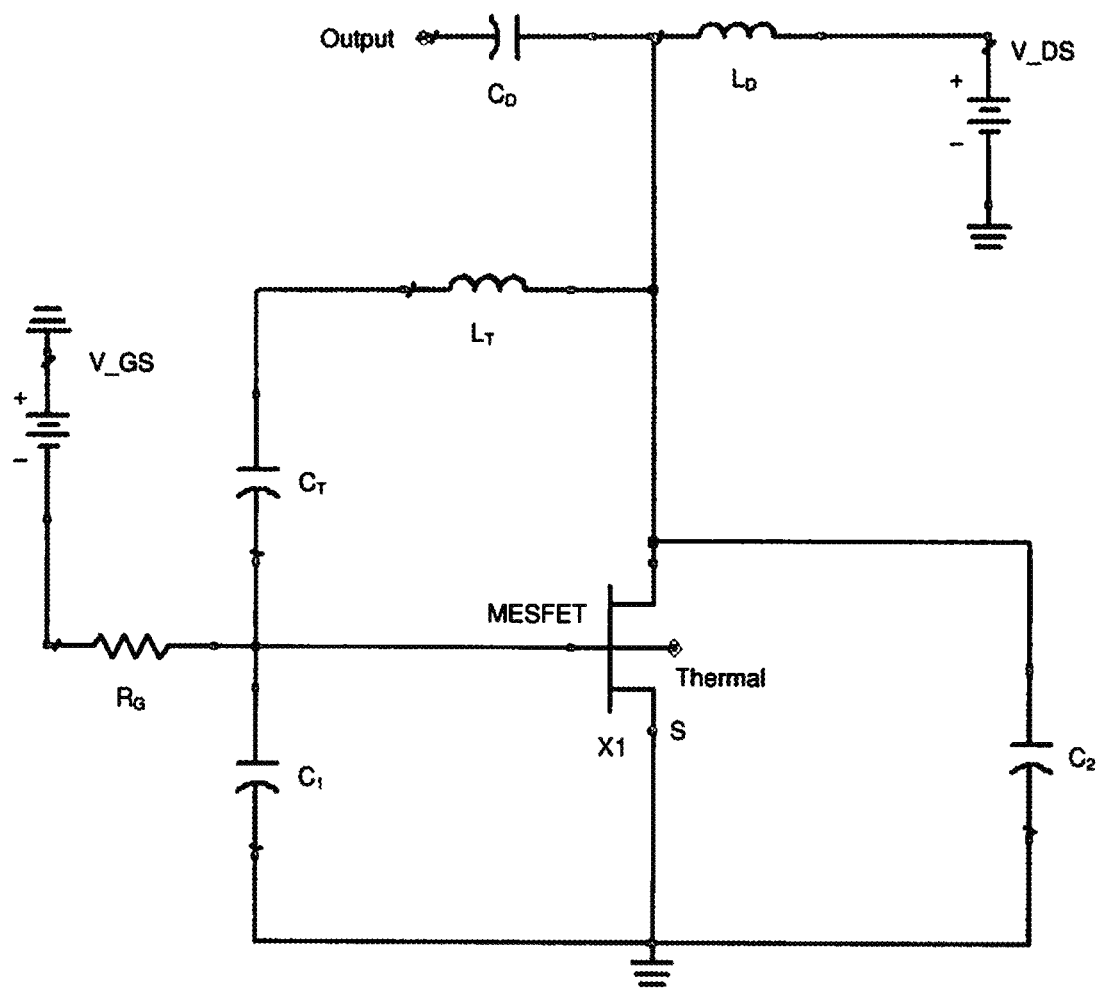
FIG. 16 is a circuit schematic illustrating a Clapp-type oscillator-based pressure sensor system, according to an embodiment of the present invention.

FIG. 16 is a circuit schematic illustrating a Clapp-type oscillator-based pressure sensor system 1600, according to an embodiment of the present invention. System 1600 includes a Clapp-type oscillator with a MEMS capacitive pressure sensor located in the LC tank circuit of the device. Clapp-type oscillator system 1600 in this design includes one inductor $L_T$, three capacitors $C_T$, $C_1$, $C_2$, and one MESFET. DC bias circuitry V_DS, V_GS is added at the gate and drain inputs and may include a series 10 kΩ resistor $R_G$ on the gate and two 90 pF MIM capacitors $C_D$ in shunt (see, for example, capacitors 2020, 2022 in FIG. 20) and a 390 nH wirewound inductor $L_D$ on the drain. The Clapp-type oscillator design was selected because it requires significantly fewer passive components than other oscillator designs. Under conditions characteristic of a gas turbine engine (e.g., high temperature and high vibration), fewer environmentally sensitive components reduces the probability of failure.

Moreover, because it requires fewer components, the Clapp-type design can be made into systems of a smaller form factor, enabling deployment in confined locations. Another advantage of the Clapp oscillator design is that inductor $L_T$ and capacitive pressure sensor $C_T$ (also called $C_{SENSE}$ with respect to FIG. 1) are in series, where $C_T$ is used to set the operational frequency range, while $C_1$ and $C_2$ are used to control the gain conditions. This arrangement may improve the frequency stability of the circuit, making the Clapp oscillator a better option than other oscillator designs.

Figure 17:
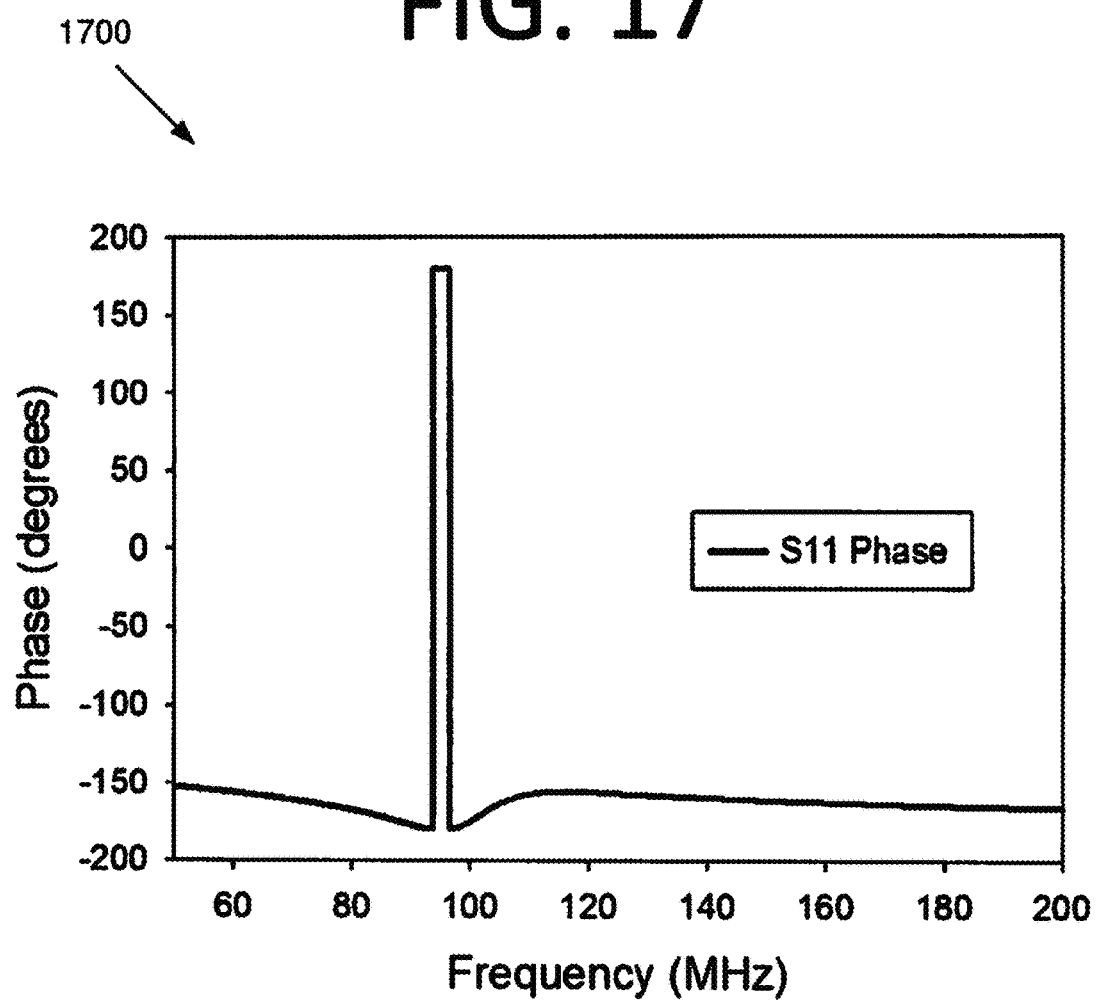
FIG. 17 is a graph illustrating that the phase of the sensor system is 0° at operating frequency, according to an embodiment of the present invention.
Figure 18:
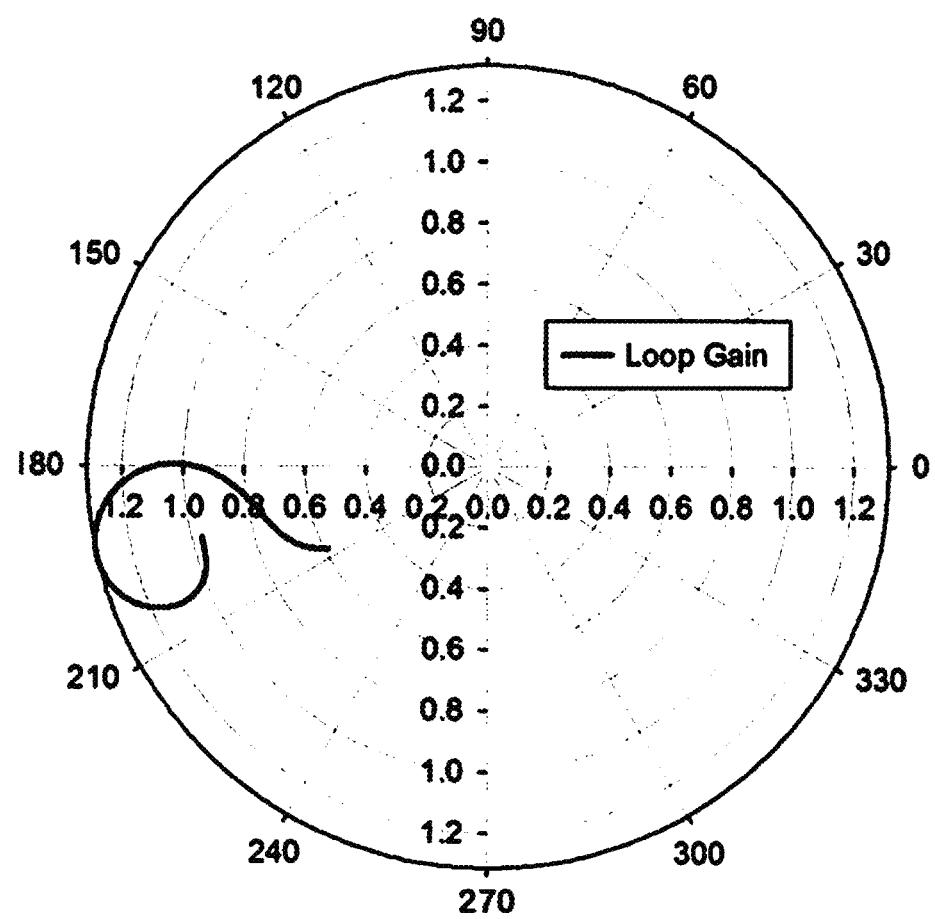
FIG. 18 is a graph illustrating that closed loop gain of the sensor system is greater than unity at operating frequency, according to an embodiment of the present invention.
Figure 19:
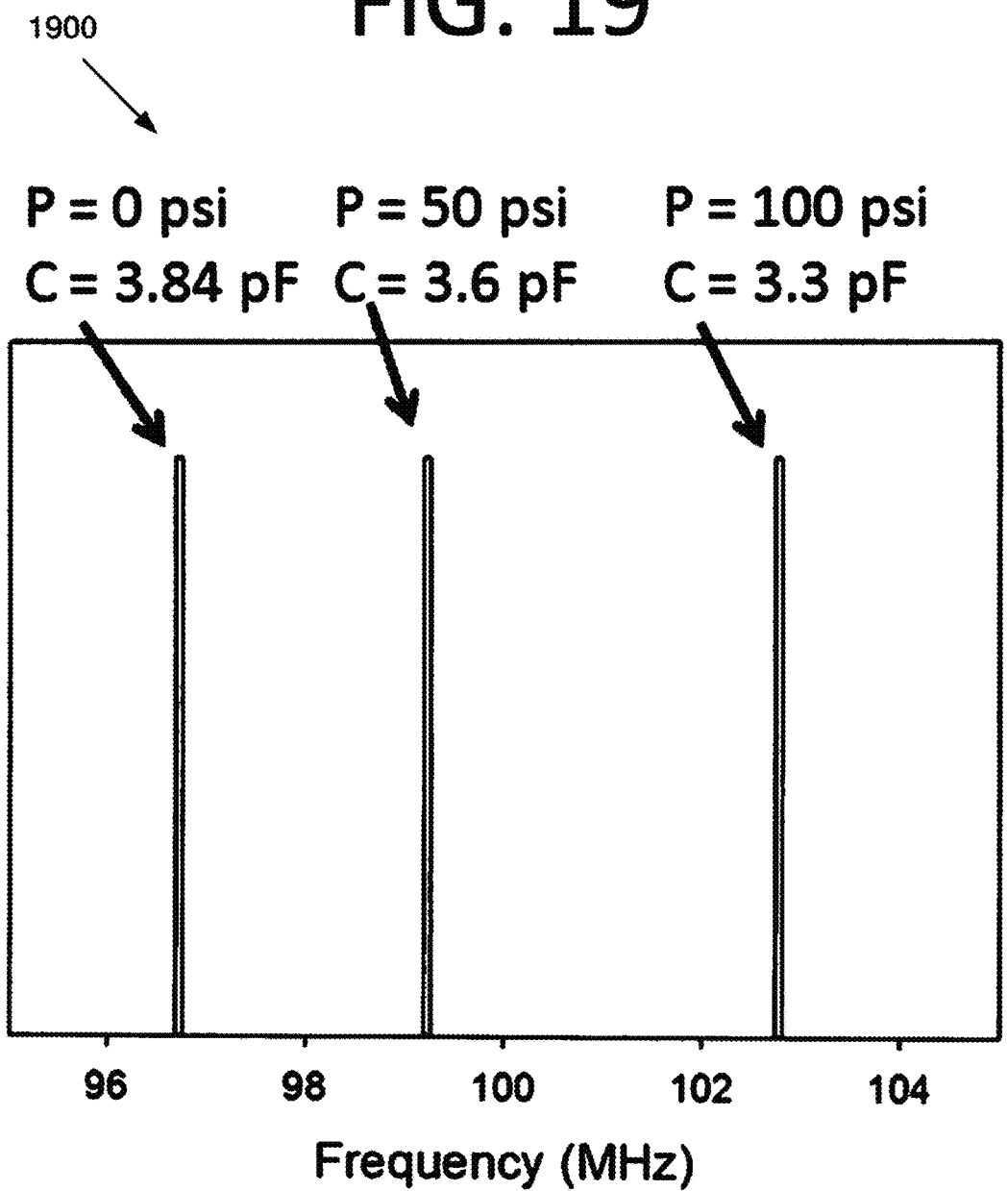
FIG. 19 is a graph illustrating pressure sensor system resonate frequency changes as pressure sensor capacitance changes due to pressure, according to an embodiment of the present invention.

The pressure sensor system of some embodiments was designed with the Keysight™ ADS circuit simulator. A MESFET was used for all simulations in some embodiments. The values for $C_T$, $L_T$, $C_1$, $C_2$, $R_G$, $L_D$, and $C_D$ may be 3.84 pF, 780 nH, 14 pF, 41 pF, 10 kΩ, 390 nH, and 188 pF, respectively. The two main criteria for an oscillator to achieve oscillation at the operating frequency may be: (1) the phase of the device is around 0°; and (2) the loop gain is close to unity. The simulated S-parameters are shown in graphs 1700 and 1800 of FIGS. 17 and 18. The S-parameters show that the phase is 0° and the closed-loop gain is greater than unity at an operating frequency of 97 MHz. To simulate the response of the pressure sensor system, the capacitance of the sensor $C_T$ is decreased, and therefore, the resonant frequency of the system increases. As the pressure increases from 0 to 100 psi, the frequency of the pressure sensor system increases from 97 to 103 MHz, which is an increase of 6%. To capture this response, a harmonic balance simulation was performed and the results are shown in graph 1900 of FIG. 19. The results indicate that when the capacitive pressure sensor is 3.84 pF (0 psi), 3.6 pF (50 psi), and 3.3 pF (100 psi), the resonant frequency is approximately 96.7 MHz, 99.2 MHz, and 102.8 MHz, respectively.

Fabrication and Packaging

FIG. 20 is a top view illustrating an assembled pressure sensor system 2000, according to an embodiment of the present invention. Pressure sensor system 2000 was fabricated on an alumina substrate 2010. Pressure sensor system 2000 may be housed within a suitable fixture, such as a stainless steel metal packaging fixture (not shown). Substrate 2010 may be very small in some embodiments (e.g., 3.5 mm wide by 5 mm long by 500 μm thick).

As with FIG. 16, pressure sensor system 2000 has an output 2002, a drain 2004, a source 2006, and a gate 2008. Two-way arrows indicate that output 2002 is connected to first MIM capacitor 2020, and that drain 2004, source 2006, and gate 2008 are connected to respective conductors (shown in gray). MIM capacitors 2020, 2022 are connected in shunt. $R_G$ 2040, $C_1$ 2050 and $C_2$ 2052, MESFET 2060, $L_T$ 2070, 2072, and pressure sensor $C_S$ 2080 are all connected and operate as described above.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
   an inductor;
   a pressure sensing capacitor connected to the inductor in series;
   a first capacitor;
   a second capacitor; and
   a field effect transistor (FET) connected to the inductor, the pressure sensing capacitor, the first capacitor, and the second capacitor, wherein
   the inductor, the pressure sensing capacitor, the first capacitor, the second capacitor, and the FET form a common source Clapp-type oscillator, and
   the apparatus is configured to operate at temperatures in excess of 400° C.

2. The apparatus of claim 1, wherein the pressure sensing capacitor is located on an LC tank circuit of the apparatus.

3. The apparatus of claim 1, further comprising:
   a gate;
   a drain; and
   DC bias circuitry operably connected to the gate and the drain, wherein
   the DC bias circuitry comprises:
      a series resistor on the gate, and
      two metal-insulating-metal (MIM) capacitors in shunt and a wirewound inductor on the drain.

4. The apparatus of claim 3, wherein
   the resistor has a resistance of at least 10 kiloohms,
   the capacitors have capacitances of at least 90 picofarads, and
   the wirewound inductor has an inductance of at least 390 nanohenry.

5. The apparatus of claim 3, wherein the pressure sensing capacitor, the inductor, the first capacitor, the second capacitor, the gate resistor, the drain wirewound inductor, and the drain MIM capacitors have the following respective properties: 3.84 picofarads, 780 nanohenry, 14 picofarads, 41 picofarads, 10 kiloohms, 390 nonohenry, and 188 picofarads.

6. The apparatus of claim 1, wherein the pressure sensing capacitor sets an operational frequency range of the apparatus.

7. The apparatus of claim 1, wherein the first capacitor and the second capacitor control gain conditions.

8. The apparatus of claim 1, wherein a phase of the apparatus is approximately 0° and loop gain is close to unity.

9. The apparatus of claim 1, wherein an operating frequency of the apparatus is at least 97 megahertz.

10. A capacitive pressure sensor, comprising:
    an inductor;
    a pressure sensing capacitor connected to the inductor in series;
    a first capacitor;
    a second capacitor;
    a field effect transistor (FET) connected to the inductor, the pressure sensing capacitor, the first capacitor, and the second capacitor;
    a gate;
    a drain; and
    DC bias circuitry operably connected to the gate and the drain, the DC bias circuitry comprising a series resistor on the gate, two metal-insulating-metal (MIM) capacitors in shunt, and a wirewound inductor on the drain, wherein
    the inductor, the pressure sensing capacitor, the first capacitor, the second capacitor, and the FET form a common source Clapp-type oscillator, and
    the capacitive pressure sensor is configured to operate at temperatures in excess of 400° C.

11. The capacitive pressure sensor of claim 10, wherein
    the resistor has a resistance of at least 10 kiloohms,
    the capacitors have capacitances of at least 90 picofarads, and
    the wirewound inductor has an inductance of at least 390 nanohenry.

12. The capacitive pressure sensor of claim 10, wherein the pressure sensing capacitor, the inductor, the first capacitor, the second capacitor, the gate resistor, the drain wirewound inductor, and the drain MIM capacitors have the following respective properties: 3.84 picofarads, 780 nanohenry, 14 picofarads, 41 picofarads, 10 kiloohms, 390 nonohenry, and 188 picofarads.

13. The capacitive pressure sensor of claim 10, wherein the pressure sensing capacitor sets an operational frequency range of the capacitive pressure sensor.

14. The capacitive pressure sensor of claim 10, wherein the first capacitor and the second capacitor control gain conditions.

15. The capacitive pressure sensor of claim 10, wherein a phase of the capacitive pressure sensor is approximately 0° and loop gain is close to unity.

16. The capacitive pressure sensor of claim 10, wherein an operating frequency of the capacitive pressure sensor is at least 97 megahertz.

17. A common source Clapp-type oscillator, comprising:
    an inductor;
    a pressure sensing capacitor connected to the inductor in series;
    a first capacitor;
    a second capacitor; and
    a field effect transistor (FET) connected to the inductor, the pressure sensing capacitor, the first capacitor, and the second capacitor.

18. The common source Clapp-type oscillator of claim 17, wherein
    The common source Clapp-type oscillator is configured to operate at temperatures in excess of 400° C.

19. The common source Clapp-type oscillator of claim 17, further comprising:
    a gate;
    a drain; and
    DC bias circuitry operably connected to the gate and the drain, wherein
    the DC bias circuitry comprises:
       a series resistor on the gate, and
       two metal-insulating-metal (MIM) capacitors in shunt and a wirewound inductor on the drain.

20. The common source Clapp-type oscillator of claim 19, wherein the pressure sensing capacitor, the inductor, the first capacitor, the second capacitor, the gate resistor, the drain wirewound inductor, and the drain MIM capacitors have the following respective properties: 3.84 picofarads, 780 nanohenry.

\* \* \* \* \*